US005106776A

United States Patent [19]

Shen et al.

[11] Patent Number: 5,106,776

[45] Date of Patent: Apr. 21, 1992

[54] METHOD OF MAKING HIGH PERFORMANCE COMPOSED PILLAR DRAM CELL

[75] Inventors: Bing W. Shen; William F. Richardson, both of Richardson; Robert R. Doering, Plano, all of Tex.

[73] Assignee: Texas Instruments Incorporated, Dallas, Tex.

[21] Appl. No.: 700,724

[22] Filed: May 15, 1991

Related U.S. Application Data

[62] Division of Ser. No. 200,823, Jun. 1, 1988.

[51] Int. Cl.[5] .............................................. H01L 21/70

[52] U.S. Cl. ........................................ 437/52; 437/47; 437/48; 437/60; 437/203; 437/919

[58] Field of Search ....................... 437/38, 47, 48, 52, 437/60, 191, 193, 195, 203, 228, 235, 919; 156/644; 357/23.6, 51

[56] References Cited

U.S. PATENT DOCUMENTS

| | | | |
|---|---|---|---|
| 4,672,410 | 6/1987 | Miura et al. | 357/23.6 |
| 4,751,558 | 6/1988 | Kenney | 357/23.6 |
| 4,830,978 | 5/1989 | Teny et al. | 357/23.6 |
| 5,008,214 | 4/1991 | Redwine | 437/228 |

FOREIGN PATENT DOCUMENTS

| | | |
|---|---|---|
| 0198590 | 10/1986 | European Pat. Off. . |
| 0073366 | 4/1986 | Japan . |

*Primary Examiner*—Brian E. Hearn
*Assistant Examiner*—Tom Thomas
*Attorney, Agent, or Firm*—James C. Kesterson; B. Peter Barndt; Richard L. Donaldson

[57] ABSTRACT

A dRAM memory cell structure and a method for forming the same is disclosed. Each memory cell is formed at a pillar, where the storage plate is an inversion region created by a field plate surrounding all sides of each pillar and separated therefrom by a storage dielectric film. The field plate is formed in a grid shape, and is disposed at the bottom of the trenches surrounding the array of pillars to serve as the fixed plate for all storage capacitors in the array. At the top of each pillar is a diffusion to which the bit lines are connected. Disposed in the trench above the field plate and extending in one direction are word lines. Each word line is formed of a polysilicon filament onto which tungsten is deposited by way of selective CVD. The word line is formed closely adjacent the pillars in its associated row, separated therefrom by a gate dielectric film, the word line is separated from the adjacent row by a dielectric film which is thicker than the gate dielectric, so that the word line will cause conduction between the inversion region and the top diffusion for its associated row, but not for the adjacent row.

8 Claims, 9 Drawing Sheets

METHOD OF MAKING HIGH PERFORMANCE COMPOSED PILLAR DRAM CELL

This is a continuation of application Ser. No. 07/200,823 filed Jun. 1, 1988.

This invention is in the field of integrated circuits, and is more specifically directed to dynamic random access memory (dRAM) memory cells.

BACKGROUND OF THE INVENTION

The one-transistor storage cell for semiconductor dynamic random access memories (dRAMs) consists of a capacitor and an access transistor, controlled by a select signal (commonly referred to as a word line) for connecting one plate of the capacitor to a data line (commonly called the bit line). Conventional dRAMs are organized so that multiple storage cells are selected by the energizing of a word line, each of the selected cells communicating their contents to sense amplifiers by way of the associated bit line.

As for any integrated circuit, the trend for dRAMs is toward greater density of storage cells per unit area of semiconductor. However, the greater density of storage cells generally forces the storage cell capacitance to decrease. As the storage capacitance decreases, the amount of charge placed on the bit line by the storage capacitor decreases, resulting in a weaker signal for sensing by the sense amplifier, and also resulting in an increased sensitivity of the memory to disturbances such as electrical noise or exposure to alpha particle radiation.

Furthermore, as the dRAM storage capacity increases, the number of cells selected by a word line will generally increase, as well as the number of cells associated with a given bit line. The physical length of the word line and the bit line, relative to its cross sectional area, will also increase accordingly, in turn increasing the series resistance of the word line and the bit line. The access time of a dRAM is directly affected by the series resistance of the word line, as the time required to energize the far end of the word line from the row decoder, and to select the last storage cell, depends upon the RC time constant of the word line as it is driven from the off to the on state. The series resistance of the bit line also impacts the memory access time, as the time required for a storage cell to establish its signal on the bit line depends upon the RC time constant of the bit line. It should be noted that the trend of larger dRAM storage capacity is being accompanied by a trend toward faster access times.

Furthermore, in recent years dRAM devices have been fabricated in lightly-doped epitaxial layers formed on the surface of a substrate, for purposes of noise reduction and increased alpha particle radiation tolerance. However, the use of epitaxy significantly increases the fabrication costs of the device.

Prior dRAM cells have been formed by incorporating both the storage capacitor and the pass gate into a trench. Examples of such dRAM cells are described in copending applications Ser. No. 106,958 filed Oct. 14, 1987, Ser. No. 026,356 filed Mar. 16, 1987, and Ser. No. 153,547 filed Feb. 9, 1988, all assigned to Texas Instruments Incorporated. Particularly, the cells described in said application Ser. No. 026,356 have a word line extending closely along one side of a trench to control conduction in a pass transistor along the side of the trench between a diffused bit line and a buried diffusion. The buried diffusion is connected by way of a buried lateral contact to a polysilicon plug disposed within the trench at the bottom thereat. While the cells of said application Ser. No. 026,356 provide reduced word line capacitance relative to those of application Ser. No. 106,958, for example, the buried lateral contact reduces the scalability of the cell to smaller geometries. Furthermore, the cell of said application Ser. No. 153,547 provides for a cell without a buried lateral contact, but uses polysilicon word lines on all sides of a pillar, causing for high series word line resistance as well as high parasitic capacitance.

It is an object of this invention to provide a dRAM storage cell which provides high storage capacitance per unit of semiconductor surface area.

It is a further object of this invention to provide such a dRAM storage cell which allows for the use of low resistance word lines and bit lines.

It is a further object of this invention to provide such a dRAM storage cell which is scalable.

It is a further object of this invention to provide such a dRAM storage cell which has adequate performance without the use of epitaxy in its formation.

Other objects and advantages of this invention will become apparent to those of ordinary skill in the art having reference to the following specification in conjunction with the drawings.

SUMMARY OF THE INVENTION

The invention may be incorporated into a dRAM storage cell having both the storage capacitor and the access transistor along the sides of a pillar. The storage capacitor has a first plate at a fixed voltage disposed in a trench between pillars, and has a second plate consisting of an inversion region in the pillar opposite the first plate and separated therefrom by a gate oxide. The gate of the access transistor is a polysilicon filament, in contact with a metal electrode, both disposed in the trench on one side of the storage pillar, separated therefrom by a gate oxide. A diffused region is present at the top of the pillar and connected to a metal bit line, so that the access transistor forms an inversion channel between the diffused region and the second plate of the capacitor when the word line is energized.

Figure 2:
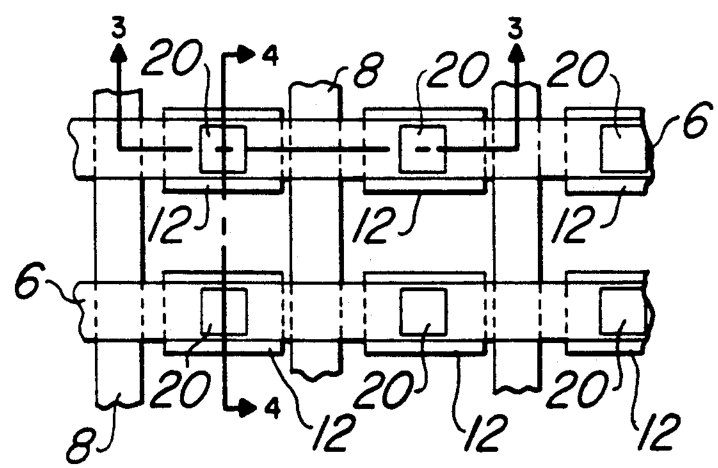
FIG. 2 is a plan view of four dRAM storage cells constructed according to the invention.

FIG. *2a* is a plan view of FIG. 2 showing the underlying field plate grid.

Figure 3:
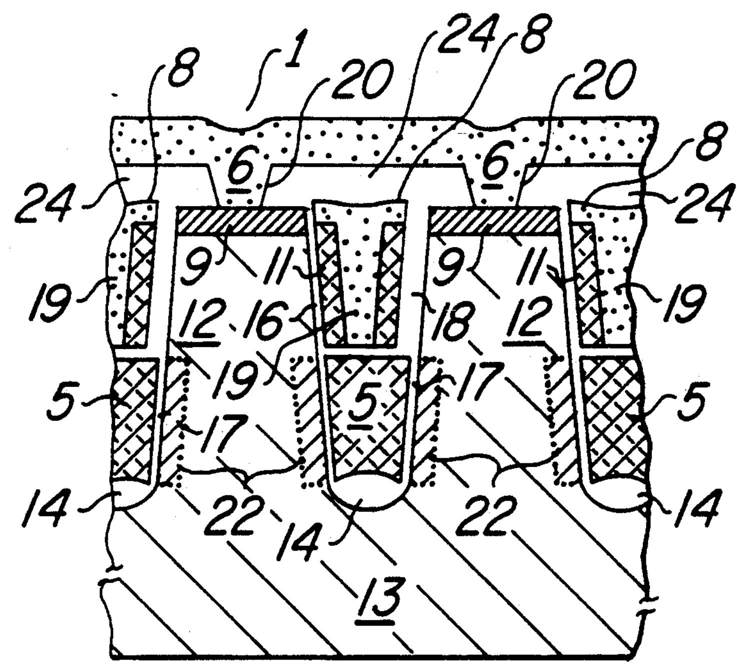

FIG. 3 is a cross-sectional view of one of the storage cells of FIG. 2, illustrating the access transistor.

Figure 4:
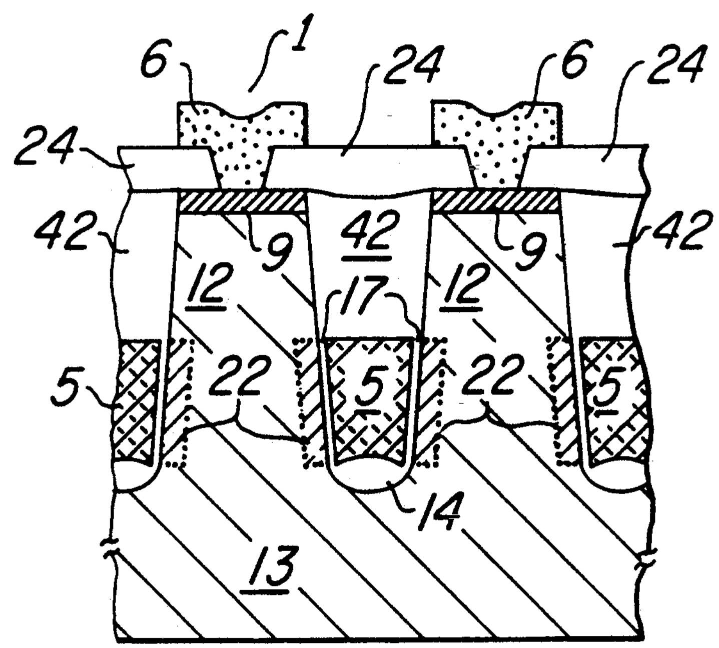

FIG. 4 is a cross-sectional view of one of the storage cells of FIG. 2, illustrating the isolation between storage cells.

FIGS. *5a* through *5p* are cross-sectional views of various steps in the construction of the storage cells according to the invention.

FIGS. *6a* and *6b* are cross-sectional views illustrating an alternative method for forming cell-to-cell isolation according to the invention.

FIGS. *7a* through *7h* are cross-sectional views illustrating an alternative embodiment for the formation of the storage cells according to the invention.

DETAILED DESCRIPTION OF THE PREFERRED EMBODIMENT

Figure 1:
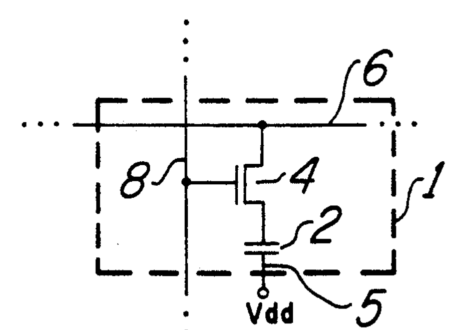
FIG. 1 is an electrical schematic of the one-transistor dRAM storage cell.

Referring to FIG. 1, the well-known one-transistor dynamic random access memory (dRAM) storage cell 1 is illustrated in schematic form. Data is stored on capacitor 2, which has a first plate connected, via a line 5, to a fixed voltage source, which, for the embodiment of the invention to be described herein, is the $V_{dd}$ power supply. The other plate of capacitor 2, i.e., the storage plate, is connected through an MOS pass transistor 4 to a bit line 6. The gate of pass transistor 4 is connected to a word line 8. As is well known in the dRAM art, a row of memory cells 1 in a rectangular array is selected by the energizing of a word line 8 selected from a row address signal received by the dRAM device. The selected word line 8 turns on the respective pass transistors 4 to which it is connected, connecting the storage plates to the associated bit line 6. Sense amplifiers, not shown, compare the resultant voltage of the bit lines 6 against a reference level to determine the data state stored by the selected capacitor 2 (i.e., absence or presence of charge thereupon). Bit line 6 of course also is used to communicate the data to be stored on the storage plate of selected capacitors 2, during the write and restore (refresh) operations.

FIG. 2 illustrates, in plan view, a group of memory cells 1 constructed at a surface of a semiconducting substrate according to the invention. Cells 1 are defined by individual pillars 12 which are formed by etching away the semiconductor material lying between the locations of pillars 12, as will be described in greater detail below. Word lines 8 are disposed between pillars 12 along the horizontal direction of FIG. 2, with a dielectric material is disposed between word lines 8 and pillars 12. As will be described hereinbelow, word lines 8 extend from the surface part of the way to the bottom of the pillar. The storage plate for a given cell 1 consists of the four sides of its associated pillar 12 beneath the point where the word lines 8 extend, and the source-drain path of its pass transistor 4 is located along the side of the pillar 12 which is closely adjacent a word line 8. It should be noted that each word line 8 is placed closer to pillars 12 on its left side (as shown in FIG. 2) than to those on its right side. The difference in spacing between word line 8 and the pillars 12 on opposing sides thereof is designed so that the energizing of a word line 8 will turn on the pass transistor 4 associated with pillars 12 on the side with the thinner dielectric, but will not turn on the pass transistors 4 for pillars 12 on the side with the thicker dielectric therebetween. Overlying both pillars 12 and word lines 8, and extending in a direction perpendicular to word lines 8, are bit lines 6. Bit lines 6 make contact to the top of a number of pillars 12 in a column by way of a contact via 20. The top of each of pillars 12, as described below, has a diffusion thereat such that it serves as the source of pass transistors 4 for each of pillars 12. Bit line 6 is of course isolated from word lines 8 thereunder.

Referring to FIG. *2a*, the view as FIG. 2 is shown including the field plate grid 5 with the word lines 6 and bit lines 8 removed. Field plate 5 is disposed at the bottom of the trenches between each pillar 12, and is separated from each pillar 12 by storage dielectric 17. At a location away from the array, a contact is made to field plate 5 so that it is biased to a fixed voltage, for example $V_{dd}$. Accordingly, field plate grid 5 forms the fixed plate of the storage capacitor 2 for each memory cell formed at a pillar 12, with dielectric 17 being the capacitor dielectric. Since field plate grid 5 surrounds all sides of each pillar 12, the storage capacitor similarly is formed on all sides of pillar 12.

FIG. 3 illustrates, in cross-sectional view, the vertical positioning of the components in memory cells 1 constructed according to the invention. Pillars 12 are formed from p-type substrate 13 with trenches disposed therebetween. At the bottom of each trench is located isolation dielectric 14, formed of silicon dioxide or any other appropriate dielectric material, for isolating the storage plate of pillars 12 from one another. While a dielectric 14 is shown as the isolation structure, it should be noted that alternative methods of providing cell-to-cell isolation, such as a heavily doped p-type region at the bottom of each trench, may also be used for such isolation. The isolation structure, such as isolation dielectric 14, must of course prevent the inversion of a channel at the bottom of each trench between pillars 12 with the application of the fixed voltage to field plate grid 5.

Field plate 5 is disposed above isolation dielectric 14, between each pillar and on all sides, as shown in FIG. *2a*. Field plate 5 is preferably polycrystalline silicon sufficiently doped so that the fixed bias is carried throughout field plate grid 5. Field plate 5 is separated from pillars 12 by storage dielectric 17, which may be formed of silicon dioxide, silicon nitride, or a combination thereof; an example of storage dielectric 17 is 7 nm of thermally grown silicon dioxide adjacent pillar 12 with 12 nm of LPCVD silicon nitride deposited thereupon. In this embodiment, the application of $V_{dd}$ to field plate grid 5 will cause an inversion region 22 on all sides of each pillar 12. Inversion region 22 will serve as the storage plate of the storage capacitor 2, and as the drain of the pass transistor 4 in memory cells 1 constructed according to the invention.

Disposed above field plate grid 5 in the direction of the cross-section of FIG. 3 is word line 8. Word line 8 consists of polycrystalline silicon filaments 11 on the sides opposing pillars 12, with tungsten metal portion 19 disposed therebetween. Word line 8 is separated from the pillar 12 to which it is associated as the gate of pass transistor 4 by gate dielectric 16, and is separated from the pillar 12 from which it is to be isolated by thick dielectric 18. Gate dielectric 16 can, of course, be any suitable MOS transistor dielectric material; in this embodiment, an example of gate dielectric 16 is 15 nm of thermally grown silicon dioxide. Thick dielectric 18 is similarly any known dielectric useful in integrated circuits, which has a sufficient thickness so that the energizing of a word line 8 will not turn on a parasitic pass transistor in an adjacent pillar. An example of thick dielectric is CVD silicon dioxide with a thickness exceeding 100 nm. At the top of each pillar 12 is an n+ diffusion 9, which serves as the source for the pass transistor 4 for each pillar 12. Diffusion 9 is contacted, through via 20 in interlevel dielectric 24, by metal bit line 6.

FIG. 4 is a cross-sectional view taken in an orthogonal direction from that of FIG. 3, illustrating space between pillars 12 not containing word lines 8. Field plate grid 5 is present at the bottom of the trenches between pillars 12, separated from pillars 12 by storage dielectric 17 and creating inversion regions 22 for storage of charge on all sides of pillar 12. Dielectric 42 fills the trenches between pillars 12, and interlevel dielectric 24 overlies dielectric 42 for isolation of pillars 12 from metal bit lines 6. It should be noted that dielectric 42 fills the trenches and is substantially planar with the tops of pillars 12, presenting a relatively smooth topography to the circuit.

The dRAM cell illustrated in FIGS. 2, 2a, 3 and 4 provides for a high capacitance cell for a relatively small surface area, due to the formation of the storage plate on all four sides of the pillar 12 in the inversion region. For example, referring to FIG. 2, if the pillar 12 is formed to be 0.8 micrometer on the word line 8 side and 1.2 micrometer on the other side, with 0.8 micrometer spacing, each memory cell 1 occupies a space which is 3.2 micrometer$^2$. For a pillar height of 7.5 microns, using approximately the lower 6 micrometers as the storage capacitor and 15 nm of thermal silicon dioxide as the dielectric, a cell capacitance of 56 fF can be achieved.

Additionally, the formation of the pass transistor on one side of the pillar 12 according to the invention provides for high performance operation due to low word line capacitance and providing for low series resistance. The use of a metal 19 such as CVD tungsten in word line 8 provides for low series resistance. The use of polysilicon filaments 11 gives the benefit of the high performance pass transistor relative to a transistor having a metal gate; accordingly, the word line 8 provides the benefit of low series resistance from the metal portion 19, plus good transistor characteristics from the polysilicon gate 11. The parasitic capacitance of word line 8 is minimized by placement of the word line along a single side of pillar 12, preferably (for purposes of reduced word line capacitance) along a short side of a rectangular pillar 12 as shown in FIG. 2. Furthermore, the benefits of metal as the bit line 6 material provided for low series resistance and reduced bit line capacitance.

Figure 2A:
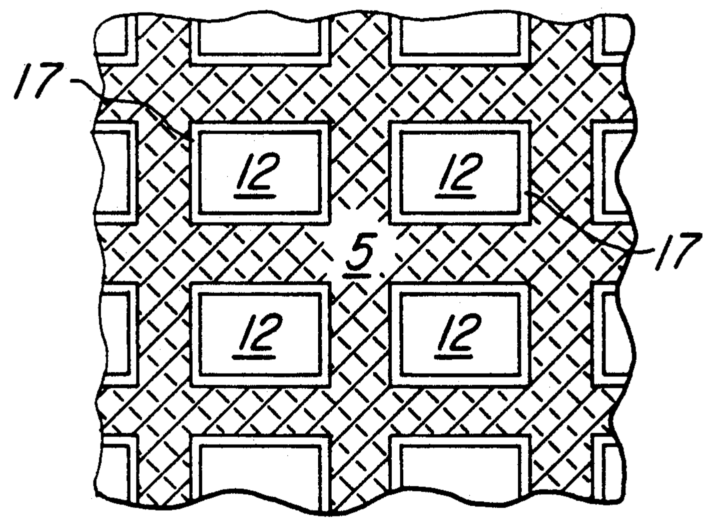

It should be noted that the array shown in FIGS. 2 and 2a provide for some degree of flexibility of use. It may be useful to design multiple dRAM types using a single array, such multiple types including conventional single-bit output dRAMs and including serial output dRAMs, video dRAMs, cache dRAMs and the like. Modern dRAM devices are physically rectangular, but not square (e.g., for a 1 Mbit dRAM, the array may be 512 rows by 2048 columns). Accordingly, it may be preferable to run the word lines in one direction, such as that shown in FIG. 2, for a first type of dRAM, but in the design of another dRAM type the word lines may be advantageously run in the perpendicular direction. The array of the invention provides for the flexibility of swapping the direction of the word lines 8 and bit lines 6 from one orientation to another. This occurs because the storage plate is present on all sides of each pillar 12, which allows the placement of pass transistor 4 on any of the sides for communication of the storage plate to the top diffusion 9, and bit line 6. Since the bit lines 6 and word lines 8 are isolated from one another, the bit lines 6 can easily be run in the perpendicular direction should the re-orientation of word lines 8 be desired.

Figure 5A:
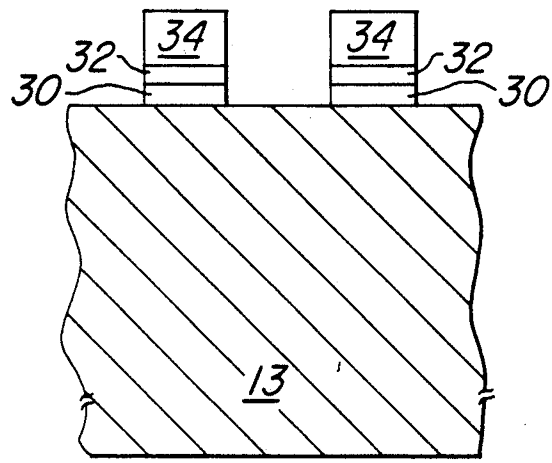
Figure 5B:
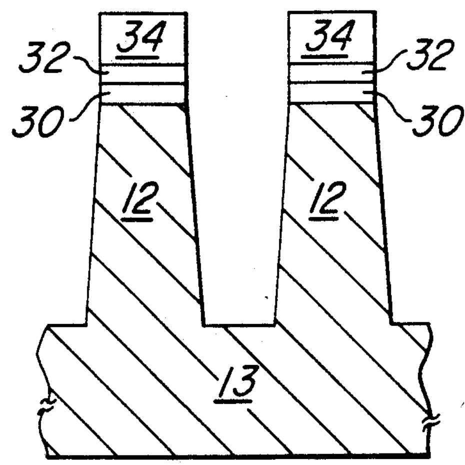
Figure 5C:
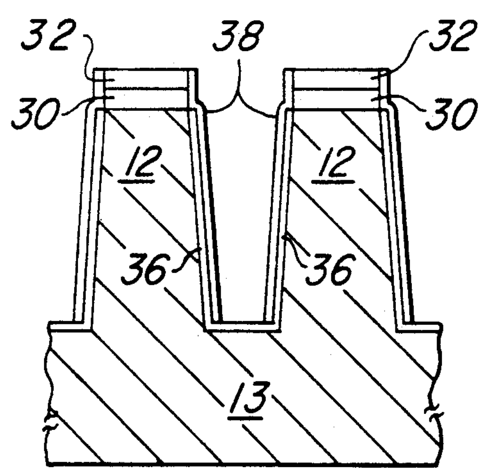
Figure 5D:
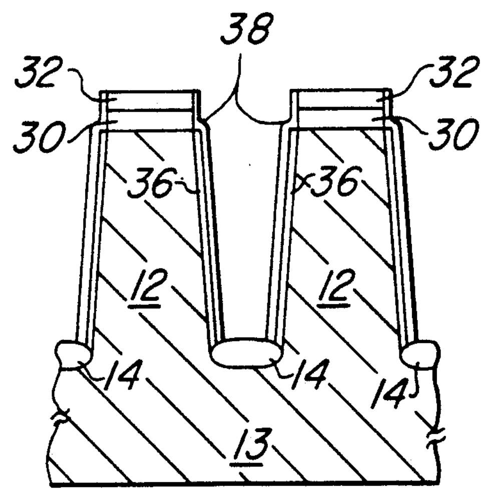
Figure 5E:
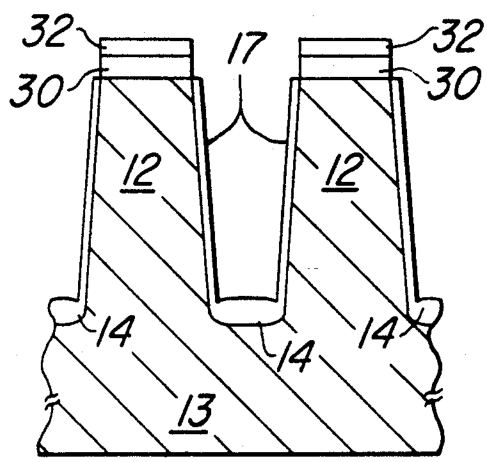
Figure 5F:
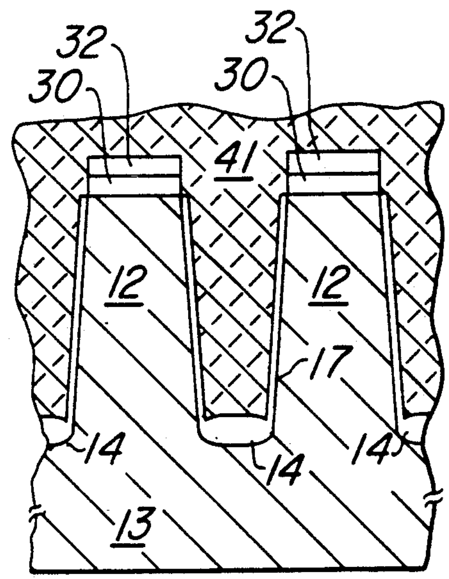
Figure 5G:
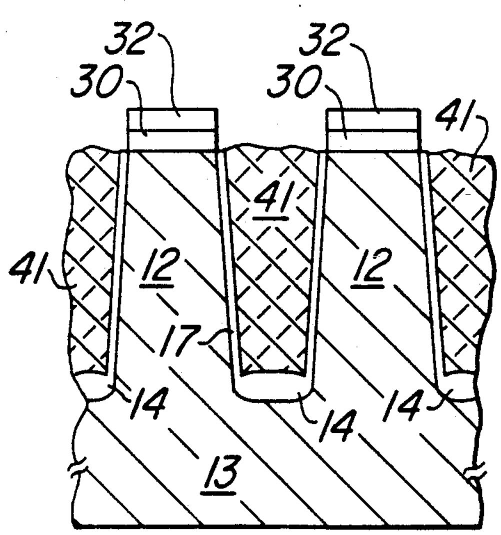
Figure 5H:
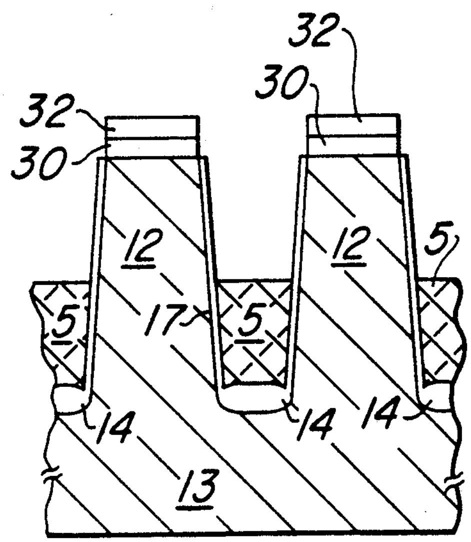
Figure 5I:
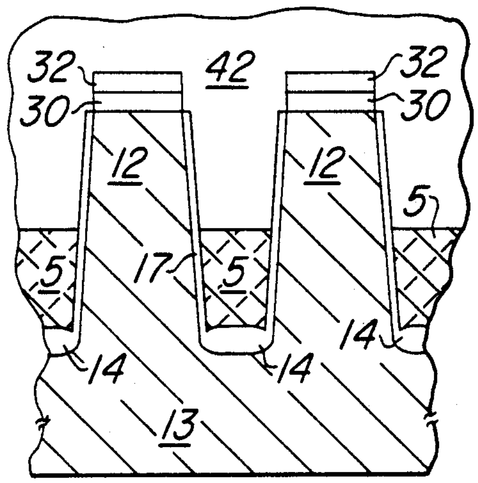
Figure 5J:
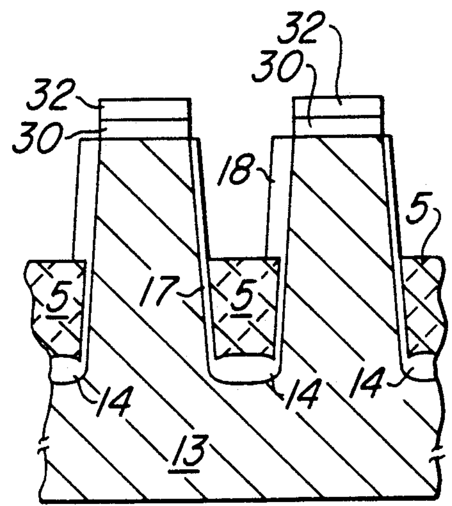
Figure 5K:
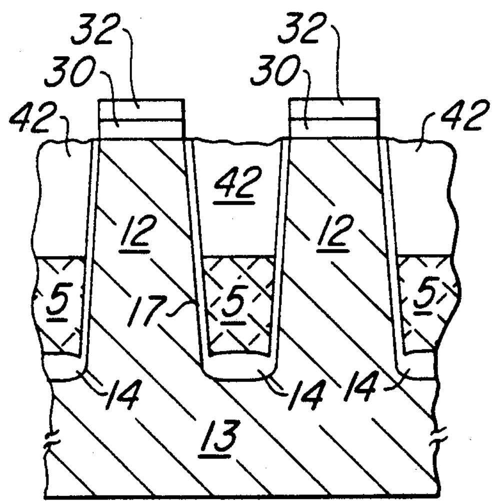
Figure 5L:
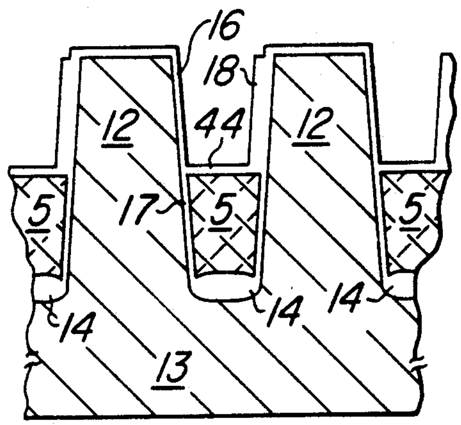
Figure 5M:
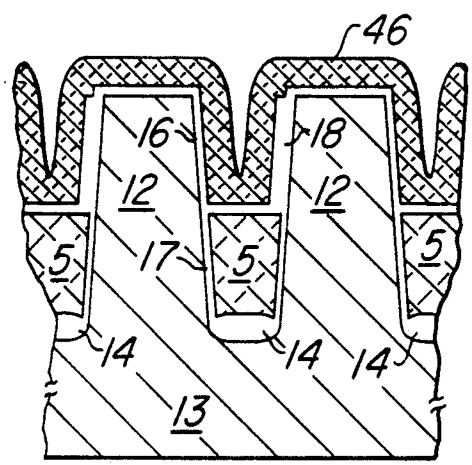
Figure 5N:
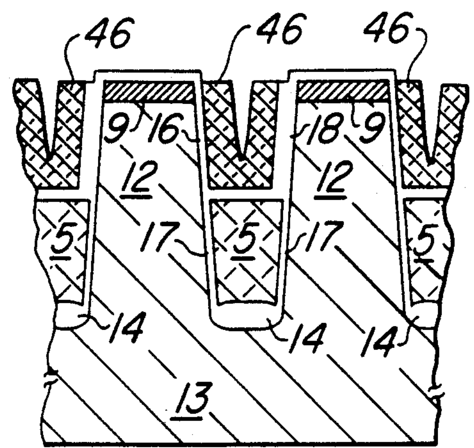
Figure 5O:
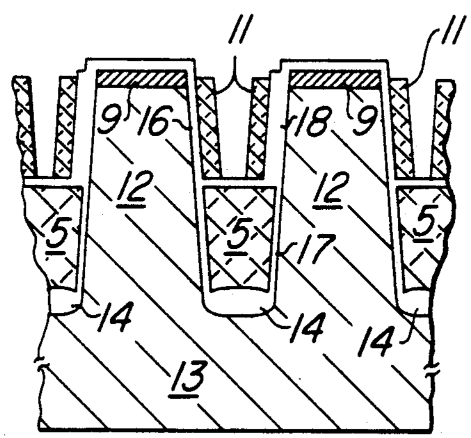
Figure 5P:
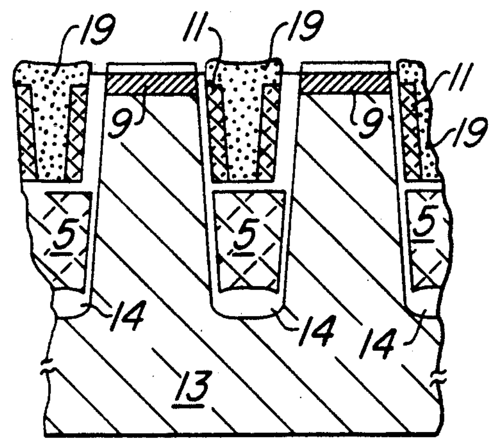

Referring now to FIGS. 5a through 5p, a method for the fabrication of a memory cell 1 according to the invention will be described in detail. Prior to the step shown in FIG. 5a, such process steps necessary in the formation of MOS or CMOS transistors (not shown) in the periphery of the dRAM having the cells 1 constructed according to the invention may be done. It should be noted that the construction of such peripheral circuitry is done independently from that of the cells 1 described herein; some steps in the formation of cells 1 may be used simultaneously in the formation of the periphery, however. Examples of the processing steps used in formation of the periphery prior to the steps shown in FIGS. 5a through 5p include the formation of n-type and p-type tanks into which the CMOS transistors may be formed, formation of isolation structures by way of local oxidation (LOCOS), and implants for channel-stop isolation and threshold voltage adjustment of the planar peripheral structures.

To form cells 1, a layer of silicon dioxide 30 is thermally grown over p-type substrate 13, to a thickness on the order of 35 nm, and a layer of silicon nitride 32 is deposited by way of LPCVD to a thickness on the order of 250 nm. It should be noted that the thickness of layer 32 is not critical, so long as it is able to maintain integrity througout subsequent nitride etch steps of various films in the trenches. A layer of oxide 34 is then deposited over the surface of nitride 32 for formation of the trench etch hard mask. Oxide 34 must be sufficiently thick to serve as a silicon etch mask, for example on the order of one micrometer thick. A layer of photoresist is applied, exposed and developed to define the locations at which trenches are to be etched between pillars 12. The layers 30, 32, and 34 are then etched at the locations of the trenches and the photoresist is removed, forming the structure of FIG. 5a. The trenches are formed at the exposed locations of substrate 13 by way of a plasma silicon etch. An example of such an etch is described in U.S. Pat. No. 4,690,729 issued Sep. 1, 1987 and assigned to Texas Instruments Incorporated. The depth of the trench in this embodiment is on the order of 7.5 micrometers, and is illustrated in FIG. 5b, leaving pillars 12. Hard mask oxide 34 may then be removed. If dopant in the sidewalls of pillars 12 is desired, such as for adjustment of the threshold voltage of the eventual storage capacitor 2 and pass transistor 4, such dopant may be introduced at this time by way of a deposited diffusion source, or by way of gas phase diffusion. The effectiveness of implanting dopant into the sidewalls of pillars 12 is of course reduced by the steepness of the angle of the trench, in conjunction with the narrowness of the trench opening (on the order of 1 micrometer).

As described above, the sides of each pillar 12 are to be electrically isolated from one another with field plate grid 5 disposed near the bottoms of the trenches therebetween. This isolation may be done by way of a number of known techniques, such as ion implantation of the bottom of the trench, formation of a dielectric material at the bottom of the trench to a sufficient thickness as to cause isolation, or a combination of the two.

Another isolation technique is the formation of a blocking nitride on the sidewalls but not the bottom of the trench, and subsequent thermal growth of a thick silicon dioxide layer on the exposed bottom. A layer 36 of silicon dioxide is grown on the sidewalls of pillars 12 and the bottom of the trench to a thickness on the order of 20 nm, and a layer 38 of silicon nitride is deposited over oxide layer 36 to a thickness on the order of 40 nm. Nitride layer 38 is etched from the bottom of the trench, but not the sidewalls, by way of an anisotropic plasma etch, leaving the structure shown in FIG. 5c. It should be noted that oxide layer 36 is preferably used in order to protect the surface of the sidewall of pillar 12 from damage which may occur from the direct deposition and subsequent removal of nitride layer 38 on silicon; if the damage from the deposition and removal of such a a nitride layer can be tolerated, oxide layer 36 may be omitted. Field oxide is then grown by way of thermal oxidation of the exposed silicon at the bottom of the trench, preferably by way of high pressure oxidation at 1000 degrees Celsius, at 10 atmospheres. A detailed description of formation of field oxide at the bottom of a trench or recess is given in copending application Ser. No. 022,164 filed Mar. 5, 1987 and assigned to Texas Instruments Incorporated. Nitride layer 38 and oxide layer 36 may then be stripped from the sides of pillars 12. Field oxide structures 14 are thus formed in the structure shown in FIG. 5*d*, having a thickness on the order of 200 nm to 400 nm.

The method described above for formation of the field oxide 14 at the bottom of the trenches between pillars 12 has limitations when the dimensions of the spacing between pillars 12 becomes less than a micrometer, as of course is desired to form high density memories. The limitations of such thermal field oxide growth arise from the narrow surface at the bottom of the trench, having nitride masking on the adjacent sidewalls from layer 38, as mechanical stresses limit the thickness that field oxide 14 can be grown in such a small location as the bottom of a sub-micron trench.

Figure 6A:
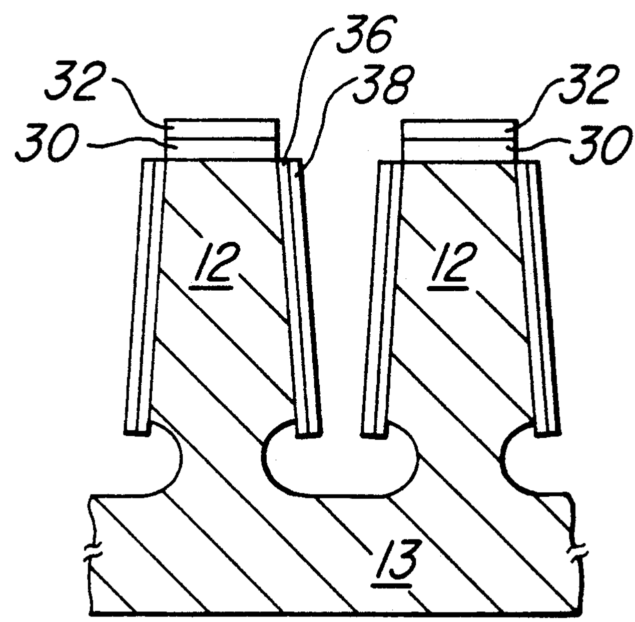
Figure 6B:
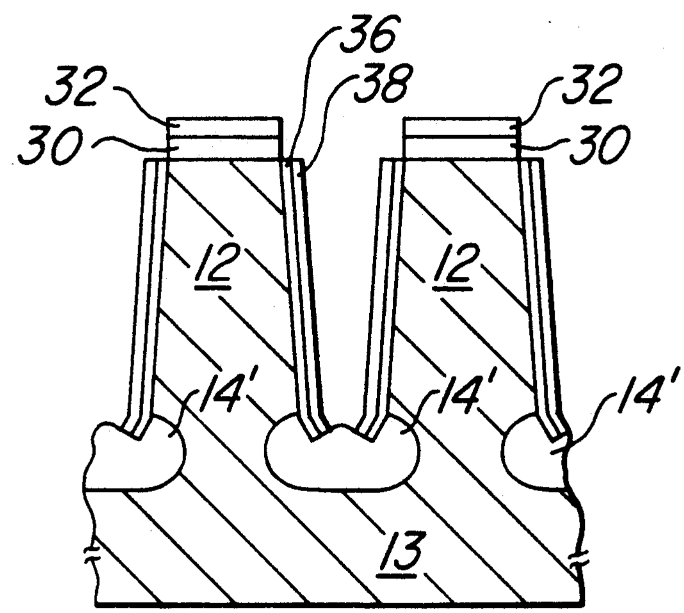
Figure 7A:
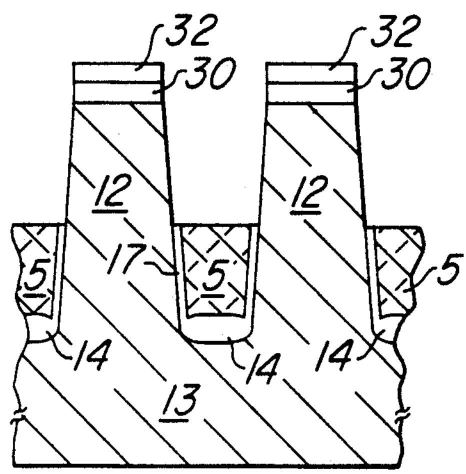
Figure 7B:
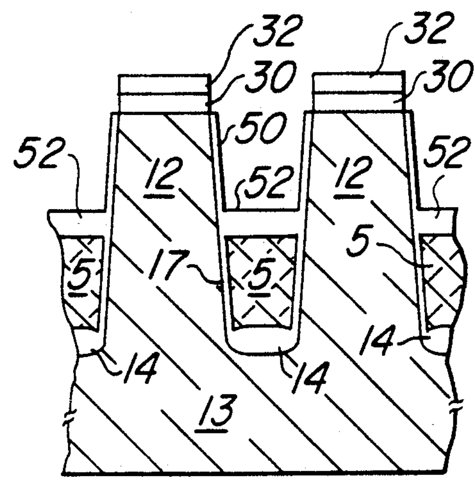
Figure 7C:
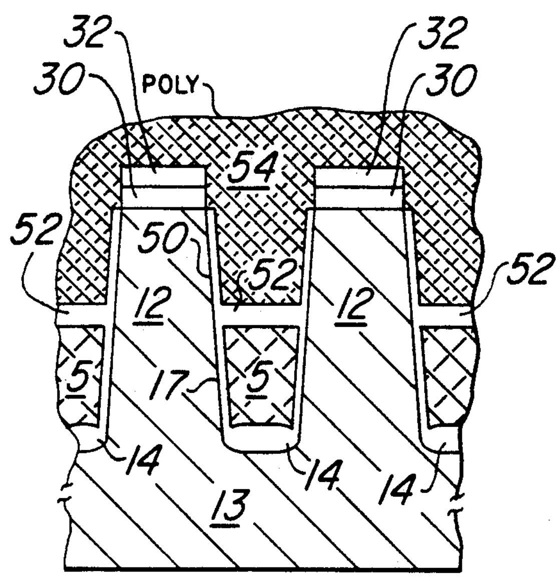
Figure 7D:
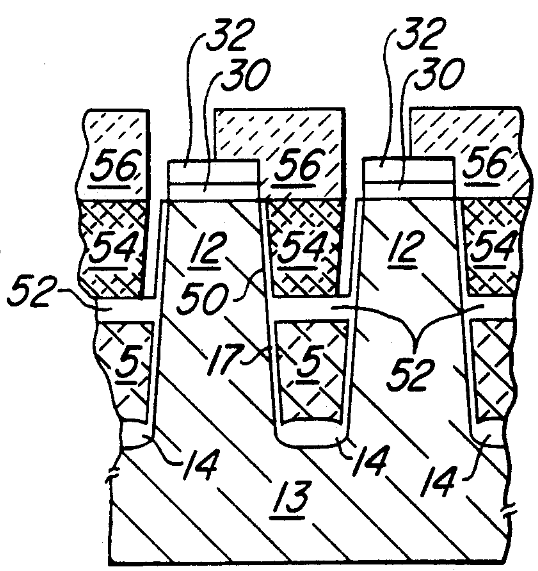
Figure 7E:
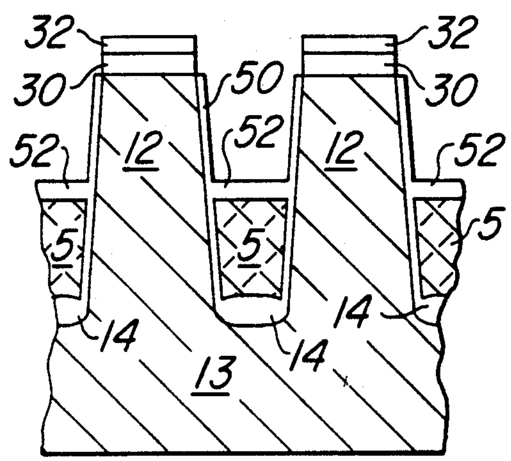
Figure 7F:
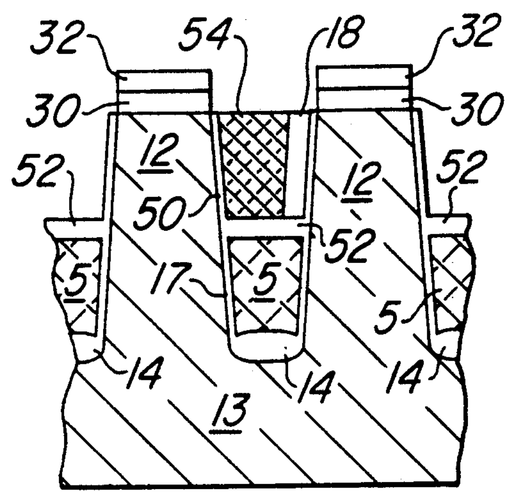
Figure 7G:
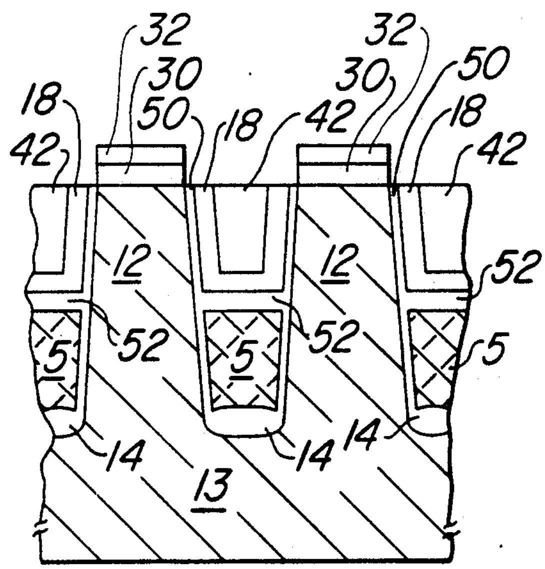
Figure 7H:
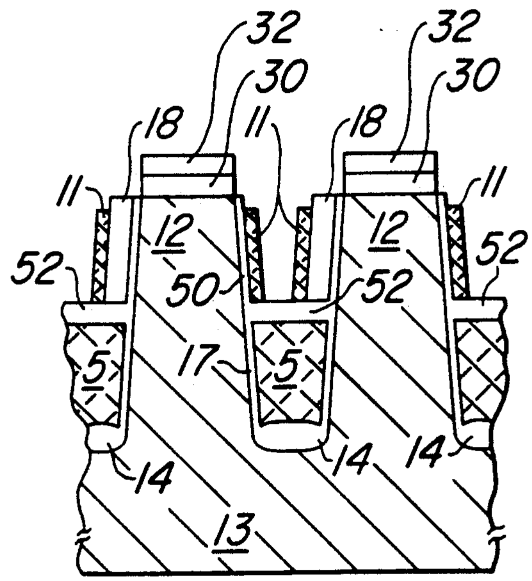

An alternative method for forming the isolation structure according to the invention is shown with reference to FIGS. 6*a* and 6*b*. After the anisotropic etch of nitride layer 38 to exposed the bottom of the trench discussed above relative to FIG. 5*c*, oxide layer 36 may be cleared from the bottom of the trench by an HF dip. An anisotropic silicon etch is then performed to expand the bottom of the trench to provide room for the formation of the isolation structure thereat. Nitride layer 38 acts as a mask along the sides of pillars 12, allowing the etch to undercut the layers 36 and 38 thereat, resulting in the structure of FIG. 6*a*, where the bottom of the trench between pillars 12 is hollowed out. At this point, if a channel stop implant is desired, it may be done in a direction normal to the surface of substrate 13, so that ions reach the bottom of the trench.

High pressure thermal oxidation, preferably at a high temperature in the range of 1000 degrees Celsius and at a high pressure such as 10 atmospheres is then used to form field oxide structures 14' within the hollowed portion of substrate 13 at the bottom of the trenches between pillars 12. The thickness of field oxide structures 14' may vary, but for minimization of stress in the surrounding substrate 13, the volume of field oxide structures 14' preferably should match the space provided by the hollowed portion of substrate 13 (accounting for consumption of substrate 13 in the oxidation process, of course). The dopant introduced in the channel stop implant will diffuse into substrate 13 during the oxidation. The resultant structure is shown in FIG. 6*b*.

After formation of field oxide 14 as shown in FIG. 5*d*, or field oxide as shown in FIG. 6*b*, nitride layer 38 and oxide layer 36 are removed from the sidewalls of pillars 12 by wet etch. For purposes of this description, field oxide 14 formed according to FIGS. 5*c* and 5*d* will be used; it should be noted, of course, that the subsequent processing described hereinbelow is equally applicable when the alternative field oxide 14' shown in FIG. 6*b* is used. An alternative method for adjusting the doping concentration at the sidewalls of pillars 12 (as opposed to doping after trench etch as described above) is to deposit a diffusion source on the sidewalls of pillars 12, or to use gas phase diffusion, after removal of nitride 38 and oxide 36.

After the removal of nitride layer 38 and oxide layer 36, and after any doping adjustment desired, the storage dielectric for the memory cell can be formed. It should be noted that either oxide layer 36 or the combination of oxide layer 36 and nitride layer 38 could serve as the storage dielectric, but it is well known in the art that the exposure of these layers to the processing steps used in formation of field oxide 14 reduces the integrity of these layers. It is therefore preferable to remove layers 36 and 38 as described above, and to reform a dielectric on the sidewalls of pillars 12 to serve as the storage dielectric. In this embodiment of the invention, an exemplary storage dielectric is formed by thermally growing an oxide layer to a thickness on the order of 7 nm, depositing a silicon nitride layer to a thickness on the order of 12 nm, and oxidizing the upper portion of the nitride layer (for example, the upper 3 nm), resulting in an oxide/nitride/oxide storage dielectric 17, illustrated in FIG. 5*e*. Of course, any known dielectric material may serve as the storage dielectric, such dielectric material including a single layer of silicon dioxide, a single layer of silicon nitride, a layer of silicon dioxide underlying a layer of silicon nitride, etc. Another alternate dielectric structure formed of a layered film of silicon nitride/silicon dioxide/silicon nitride is described in copending application Ser. No. 174,751, filed Mar. 29, 1988 and assigned to Texas Instruments Incorporated. It should be noted, however, that the inclusion of nitride in storage dielectric 17 will provide simplified processing in the formation of pass transistors 4 as will be described below, due to the ability of silicon nitride to block thermal oxidation.

After formation of storage dielectric 17, field plate grid 5 can be formed by the deposition of polysilicon 41 over the surface of substrate 13, filling the trenches between pillars 12, as shown in FIG. 5*f*. Since field plate grid 5 must be conductive, it is preferred that polysilicon 41 be doped so as to minimize its resistance. An example of a method for the deposition of doped polysilicon 41, as used in this embodiment of the invention, is the LPCVD deposition of a first layer of undoped, or lightly-doped, polysilicon to a thickness on the order of 100 nm, followed by the LPCVD deposition polysilicon which is in-situ (with the CVD) doped with an n-type dopant such as phosphorous, arsenic or antimony. Polysilicon 41 is thus preferably deposited to a thickness sufficient to fill the trenches between pillars 12, for example to a thickness on the order of 700 nm. The deposited thickness of polysilicon 42 necessary to fill the trenches will of course vary with the spacing dimensions between pillars 12. After deposition of the two layers, an anneal is done at a temperature of 900 degrees Celsius or higher, resulting in the structure of FIG. 5*f*.

In order to provide the fixed voltage bias to field plate grid 5 shown in FIGS. 2*a*, 3 and 4, it is of course necessary to provide contact to field plate grid 5. In this embodiment of the invention, this is accomplished by way of a two-step etchback process. A first plasma etch, using a polysilicon etchant such as $SF_6$, is done to substantially planarize polysilicon layer 41 to approximately the top of pillars 12, as shown in FIG. 5*g*. At this point, a masking material such as photoresist is applied, exposed and removed to expose the area of the circuit containing the memory cells 1 as shown in FIG. 2, but protecting a portion of polysilicon 41 at a location where contact is desired to be made thereto, for example at the edge of the array of memory cells 1. A plasma etch of polysilicon 41 is then performed at the exposed portions of the polysilicon layer 41 to etch back polysilicon 41 to a predetermined depth between pillars 12, such as on the order of 1 to 2 micrometers. This etch results in the formation of field plate grid 5 disposed on all sides of each pillar 12, separated therefrom by storage dielectric 17, as shown in FIG. 5*h*. At the location protected by photoresist, field plate grid 5 will extend substantially to the surface of pillars 12, facilitating subsequent contact thereto by a metal line connected to the $V_{dd}$ power supply, in this example.

After the formation of field plate grid 5, formation of the pass transistor 4 begins. An oxide layer 42 is deposited into the remaining portion of the trench between pillars 12, overlying field plate grid 5 and filling the trench, as shown in FIG. 5*i*. At this point, all sides of each pillar 12 are identical in formation, as no distinction of which side of pillar 12 is to have the word line has yet been made. A first plasma etch of oxide layer 42 is performed overall, so that oxide layer 42 is removed from the periphery of the dRAM device and and to be substantially planar with the surface of pillars 12 in the array. A masking material such as photoresist is then applied to the surface, and exposed and developed to expose the portions of oxide layer 42 where pass transistors 4 are to be formed (i.e., where word line 8 will be located), and to cover the portions of oxide layer 42 which are to remain filled as shown in the cross-sectional view of FIG. 4. The exposed locations will be a portion of the trench on the sides of pillars 12 which will have the pass transistors 4; a portion of this trench will be protected by the masking material to leave the thick oxide 18 isolating word line 8 from the adjacent pillar 12 as shown in FIG. 3. A second plasma etch is then performed to etch back oxide layer 42 to clear the surface of field plate 5 at the locations where word line 8 is to be formed. The mask allows oxide layer 42 to remain substantially planar with the surface of pillars 12 in the covered locations of the array. The resulting structure, taken in the direction of the view of of FIG. 3 is shown in FIG. 5*j*. Thick oxide filaments 18 remain from oxide layer 42 on the side of pillars 12 which are to be isolated from word line 8, as these locations were masked from the etch used to clear the other side of the trench. Storage dielectric 17, since it contains silicon nitride, remains to a large extent on the exposed portions of the sidewalls of pillars 12. FIG. 5*k* illustrates the structure at this point in the process taken in the direction of FIG. 4, showing the filling of the trenches between pillars 12 with oxide layer 42.

In order to isolate eventual word lines 8 from field plate grid 5, an isolation dielectric must be formed on top of field plate grid 5. This is done in this embodiment by thermal growth of on oxide layer 44 on top of the exposed portions of field plate grid 5. It should be noted that, since storage dielectric 17 contains silicon nitride, oxide 44 will not form on the sidewall of pillar 12 at which pass transistor 4 will be formed. Subsequent to the growth of oxide 44, storage dielectric 17 is stripped where exposed above field plate grid 5 by way of a wet nitride etch followed by a wet oxide etch, exposing the sidewall of pillar 12 at which pass transistor 4 is to be formed. Nitride layer 32 and oxide layer 30 can also be removed from the tops of pillars 12 at this time, or alternatively nitride 32 and oxide 30 may remain until immediately prior to source/drain diffusion described hereinbelow. The gate dielectric 16 for pass transistor 4 is then formed at the exposed sidewalls, and on the tops of pillars 12 (if exposed). An example of a suitable gate dielectric 16 is a layer of thermally grown silicon dioxide having a thickness on the order of 15 nm. The resultant structure is shown in FIG. 5l.

Referring to FIG. 5*m*, polysilicon layer 46 is shown deposited overall, for formation of the polysilicon gate electrodes 11 of FIG. 3. Polysilicon 46 is deposited by way of LPCVD to a thickness on the order of 400 nm, and is preferably doped so as to be substantially conductive. Similarly as field plate grid 5, polysilicon 46 can be doped in-situ during its deposition; alternatively, polysilicon 46 can be deposited in undoped form and subsequently implanted so as to be substantially conductive. The dopant type for polysilicon 46 is preferably n-type. Polysilicon layer 46 can also serve as the polysilicon for the gates of transistors in the periphery of the memory. If polysilicon 46 is to also form such transistor gates, it should be noted that gate dielectric 16 may serve as the gate dielectric for such peripheral transistors, since it is grown immediately prior to the deposition of polysilicon layer 46.

Polysilicon 46 is then etched back approximately to the tops of pillars 12. If not already removed, nitride 32 and oxide 30 are removed therefrom at this time. Diffusion 9 at the top of each pillar 12 is then formed by conventional techniques, such as by ion implantation of n-type impurities and subsequent diffusion. It should be noted that the same implant and diffusion can be used for source/drain diffusion for transistors in the periphery of the memory, if desired, so long as patterning and etching of the polysilicon layer 46 is done prior to such diffusion for the peripheral transistors. The annealing used for drive-in of diffusion 9 will also serve to additionally diffuse such dopant as is present within polysilicon 46. The resultant structure is shown in FIG. 5*n*.

After formation of the diffusion region 9, silicidation of the sources, drains and gates of the peripheral transistors may be done by way of deposition of a refractory metal such as titanium, followed by an annealing so as to for direct react silicide in the conventional manner. In such a case, it may be preferable to form a mask over the array of cells 1 so as to inhibit silicide formation on diffusions 9 and on polysilicon 46, allowing the use of selective tungsten deposition as will be described hereinbelow. However, it should be noted that word line 8 could alternatively be formed by the formation of a silicide film on polysilicon 46 shown in FIG. 5*n*, so that the series resistance of the word line consisting of silicide-clad polysilicon 46 would be reduced from what it would be if it consisted of solely polysilicon 46.

For formation of word line 8 according to the preferred embodiment of the invention, however, the structure of FIG. 5*n* would be next subjected to anisotropic plasma etching of polysilicon 46, preferably reaching the bottom of polysilicon layer 46 to leave polysilicon filaments 11 as shown in FIG. 5*o*. After this etching, a short deglaze by way of an HF dip is performed to clear filaments 11 of any native oxide. Word line 8 is then completed by the selective CVD deposition of a refractory metal such as tungsten in the conventional manner; such deposition is selective in that the metal deposits on exposed silicon but not on silicon dioxide. The resultant structure, with selective CVD tungsten lines 19 formed between each pair of polysilicon filaments 11 in a trench, is shown in FIG. 5*p*. The cells are completed by deposition of an interlevel dielectric layer 24, the patterning and etching of contact vias 20 through dielectric layer 24, and the sputtering, patterning and etching of a metallization layer to form bit lines 6, resulting in the structure illustrated in FIGS. 3 and 4.

An alternative embodiment of the method for forming the memory cell 1 will now be described relative to FIGS. *7a* through *7h*. The alternative embodiment begins with the structure of FIG. *5h*, after the etchback to form the field plate grid 5. Storage dielectric 17 on the sides of pillars 12 above field plate grid 5 is stripped to expose the sides of pillars 12 above field plate grid 5, as shown in FIG. *7a*. Gate dielectric 50 for the pass transistor 4 is then thermally grown on the exposed sides of pillar 12 to a thickness of silicon dioxide on the order of 25 nm. The formation of gate dielectric 50 also forms an isolation oxide 52 on the top of field plate grid 5 as shown in FIG. *7b*. Due to the differential oxide growth on the heavily doped field plate grid 5 relative to that of the more lightly doped sides of pillars 12, isolation oxide 52 is formed to a thickness greater than gate dielectric 50, for example to a thickness on the order of 50 to 100 nm, depending on the relative doping concentrations.

Polysilicon layer 54 is then deposited over the surface of the structure, as shown in FIG. *7c*. Polysilicon 54 is preferably doped heavily n-type, either in-situ with the deposition thereof or subsequently by way of implant and diffusion. Polysilicon 54 is then etched back overall to a depth substantially planar with the tops of pillars 12, as before. A mask layer 56, preferably formed of photoresist, is then applied and patterned to protect the portion of polysilicon 54 which is in the array between pillars 12 at which word lines 8 are to be formed. Accordingly, the mask layer 56 will expose the portions of polysilicon 54 along the sides of pillars 12 which are perpendicular to word lines 8, as well as the portions of polysilicon 54 along the sides of the pillars 12 which are to be isolated from word lines 3. Polysilicon 54 is then etched by way of a plasma etch to reach oxide 52 at the exposed locations, resulting in the structure of FIG. *7d*. FIG. *7e* is a cross-section taken in the orthogonal direction from FIG. *7d*, i.e., in the same direction as FIG. 4, illustrating the removal of polysilicon 54 between pillars 12 in the direction perpendicular to word lines 8. Mask layer 56 is then removed, and thermal oxidation is performed to form the isolation oxide 18 along the sides of polysilicon 54 which are to be isolated from the eventual word lines 8, as shown in FIG. *7f*. Isolation oxide 18 is on the order of 100 nm thick.

A dielectric layer 42, for example TEOS oxide, is deposited overall to fill the trenches in which polysilicon 54 was removed, as in the direction perpendicular to word lines 8. Dielectric 42 is then etched back to be substantially planar with the tops of pillars 12. FIG. *7g* is in the direction of FIG. *7e*, and shows the dielectric layers 18 and 42 filling the trenches between pillars 12 in this direction.

An anisotropic polysilicon etch is then performed, without a mask layer over the array, to form polysilicon filaments 11 between pillars 12, separated from one pillar by dielectric 50 and by another pillar by isolation oxide 18. This structure is illustrated in FIG. *7h*. The structure is completed by the implant and diffusion to form diffusions 9, and by forming tungsten line 19 by way of selective CVD as in the embodiment described hereinabove. The structure resulting from such steps according to this alternative embodiment is as that shown in FIGS. 3 and 4 described hereinabove.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A method of forming a memory array at a surface of a semiconductor body of a first conductivity type, comprising:

etching a trench grid at selected locations of said surface to leave a plurality of pillars arranged in rows and columns;

forming an isolation structure at the bottom of said trench grid;

forming a storage dielectric on the sides of said pillars;

forming a field plate grid disposed over said isolation structure and separated from said pillars by said storage dielectric;

forming a gate dielectric on a side of each pillar in a first row of pillars;

forming a thick dielectric on a side of each pillar in a second row of pillars, said second row of pillars being adjacent said first row of pillars on the side of said gate dielectric;

forming a word line for said first row of pillars disposed over said field plate grid and between the gate dielectric for the pillars in said first row and the thick dielectric for the pillars in said second row;

forming a diffusion at the tops of said pillars in said first row; and forming a bit line for with each column of pillars, each said bit line contacting the diffusion at the top of the pillar in said first row associated with its column.

2. The method of claim 1, wherein said step of forming said isolation structures comprises:

forming a layer comprising silicon nitride over said sidewalls of said pillars;

exposing the bottom of said trench grid; and growing an oxide layer at the bottom of said trench grid.

3. The method of claim 2, wherein said step of forming said isolation structures further comprises:

etching a hollowed portion at the bottom of said trench grid prior to said step of growing an oxide layer.

4. The method of claim 1, wherein said steps of forming said gate dielectric and forming said thick dielectric comprise:

forming a dielectric layer filling said trench grid over said field plate; and etching a selected portion of said dielectric layer lying between said first row and said second row to remove said dielectric layer near said first row of pillars, leaving said thick dielectric on the sides of said second row of pillars; and growing a gate oxide layer on the first row of pillars in the location where said dielectric layer was etched.

5. The method of claim 4, wherein said step of forming said word line comprises:

forming a polysilicon line disposed between said gate oxide layer on said first row of pillars and said thick dielectric on said second row of pillars.

6. The method of claim 5, wherein said step of forming said word line further comprises:

anisotropically etching said polysilicon line to leave a polysilicon filament adjacent said gate oxide layer on said first row of pillars; and depositing a metal layer in contact with said polysilicon filament.

7. The method of claim 6, wherein said step of depositing a metal layer comprises selective chemical vapor deposition of tungsten.

8. The method of claim 1, wherein said steps of forming said gate dielectric and forming said thick dielectric comprise:

forming a gate oxide layer on the sides of said pillars over over said field plate;

filling the trenches between said pillars with polysilicon;

etching a selected portion of said polysilicon to leave a portion thereof lying between said first row and said second row; and filling the locations where said polysilicon was etched with a dielectric material.

* * * * *